United States Patent [19]

Inoue

[11] Patent Number: 5,134,446
[45] Date of Patent: Jul. 28, 1992

[54] SEMICONDUCTOR DEVICE HAVING A BUFFER STRUCTURE FOR ELIMINATING DEFECTS FROM A SEMICONDUCTOR LAYER GROWN THEREON

[75] Inventor: Toshikazu Inoue, Kawasaki, Japan

[73] Assignee: Fujitsu Limited, Kawasaki, Japan

[21] Appl. No.: 725,889

[22] Filed: Jul. 1, 1991

Related U.S. Application Data

[63] Continuation of Ser. No. 454,966, Dec. 22, 1989, abandoned.

[30] Foreign Application Priority Data

Dec. 22, 1988 [JP] Japan ................... 63-325631

[51] Int. Cl.$^5$ .............. H01L 29/161; H01L 27/12
[52] U.S. Cl. .......................... 357/16; 357/4; 357/89; 357/90
[58] Field of Search .............. 357/16, 4, 4 SL, 89, 357/90; 437/128, 133

[56] References Cited

U.S. PATENT DOCUMENTS

| | | | |
|---|---|---|---|
| 3,821,033 | 6/1974 | Hu | 148/175 |
| 4,568,958 | 2/1986 | Baliga | 357/16 |
| 4,719,155 | 1/1988 | Matsumoto | 357/16 |
| 4,768,074 | 8/1988 | Yoshida et al. | 357/4 |
| 4,769,341 | 9/1988 | Luryi | 357/16 |
| 4,806,996 | 2/1989 | Luryi | 357/16 |
| 4,872,046 | 10/1989 | Morkoc et al. | 357/16 |

OTHER PUBLICATIONS

Journal of Vacuum Science & Technology/Section B, vol. 5, No. 4, Jul./Aug. 1987, pp. 1156–1161, Second Series, Woodbury, NY USA; J. S. Ahearn et al.: "Control of dislocations in GaAs grown on Si(211) by molecular beam epitaxy" p. 1156; FIGS. 1, 8, 10.

Applied Physics Letters, vol. 52, No. 8, Feb. 22, 1988, pp. 651–653, New York, NY, USA; R. J. Malik et al.: "Electron beam source molecular beam epitaxial growth of analog graded AlxGa1-xAs ballistic transistors" p. 652; FIG. 3.

Applied Physics Letters, vol. 50, No. 6, Feb. 9, 1987, pp. 301–303, New York, NY, USA; M. E. Givens et al.: "Effect of compositionally graded and superlattice buffer layers on the devie performance of graded barrier quantum well heterostructure laser diodes" pp. 301–303.

Research Disclosure, No. 270, Oct. 1986, p. 627, New York, NY, USA; "Intermetallic Semiconductor Buffered Substrate".

Patent Abstracts of Japan, vol. 12, No. 449 (E-686), Nov. 25, 1988; and JP-A-63 117 487 (Furukawa Electric Co. Ltd.) Jul. 21, 1988.

Patent Abstracts of Japan, vol. 12, No. 425 (E-681), Nov. 10, 1988; and JP-A-63 164 476 (Fujitsu Ltd.) Jul. 7, 1988.

Primary Examiner—Andrew J. James
Assistant Examiner—Ngan Van Ngo
Attorney, Agent, or Firm—Staas & Halsey

[57] ABSTRACT

A semiconductor service having a group III-V compound semiconductor layer formed on a buffer structure for intercepting propagation of defects, in which the buffer structure comprises a first material layer of a group III-V compound semiconductor material, a second material layer of a group III-V compound semiconductor material provided on the first material layer, the second material layer containing a first group III element and a second group III element different from the first group III element with a graded compositional profile in which the content of the second group III element is decreased towards an upper boundary and a lower boundary of the second material layer.

11 Claims, 4 Drawing Sheets

SEMICONDUCTOR DEVICE HAVING A BUFFER STRUCTURE FOR ELIMINATING DEFECTS FROM A SEMICONDUCTOR LAYER GROWN THEREON

BACKGROUND OF THE INVENTION

The present invention generally relates to semiconductor devices and more particularly to a buffer structure interposed between an upper compound semiconductor layer and a lower material layer for eliminating defects from the upper compound semiconductor layer on which semiconductor devices are to be formed.

Gallium arsenide (GaAs) is a typical compound semiconductor material used for laser diodes and various fast speed semiconductor devices such as metal-semiconductor field effect transistor (MESFET), high electron mobility transistor (HEMT), heterojunction bipolar transistor (HBT) and the like because of its characteristic band structure and high electron mobility. Such a semiconductor device is constructed on a GaAs wafer sliced from a GaAs crystal ingot or on a GaAs layer grown epitaxially on a surface of a silicon wafer. In the latter construction, one can avoid the difficulty of handling the heavy and brittle GaAs wafer during the fabrication process of the device by using a light and strong silicon wafer fabricated by a well established process for the base of the wafer. Further, a large diameter wafer can be obtained easily in such a construction. As a result, one can handle the wafer easily and reduce the manufacturing cost of the device. Further, such a wafer is suited for fabrication of a so called optoelectronic integrated circuit (OEIC) device wherein a GaAs laser diode and the like are assembled together with silicon transistors on a common semiconductor chip.

When growing GaAs on silicon wafer, however, one encounters various difficulties. Such difficulties arises mainly due to the large differences in the lattice constants and thermal expansion coefficients, as between silicon and GaAs. For example, the lattice constant of silicon is smaller than that of GaAs by about 4% and the thermal expansion coefficient of silicon is smaller than that of GaAs by about 230%. From a simple calculation based on the difference in the lattice constant, it is predicted that the GaAs substrate, constructed as such, contains dislocations with a density in the order of $10^{12}/cm^2$. Thus, a simple growth of GaAs layer directly on silicon substrate is usually unsuccessful. Even if successful, such a layer involves significant defects and is useless for the substrate of a semiconductor device.

In order to eliminate these problems and to obtain a GaAs layer grown on the underlying silicon wafer, it is proposed to interpose a buffer layer between the silicon wafer and the GaAs layer so as to reduce defects caused as a result of the mismatch in the respective lattice constants and thermal expansion coefficients. In one example, it is proposed to interpose a GaAs buffer layer between the silicon substrate and the GaAs layer (Akiyama, M. et al., Ext. Abst., 18th Int. Conf. SSDM p.16, 1986). FIG. 1 shows a typical structure in which a thin buffer layer 2 of gallium arsenide is grown on a silicon wafer 1 and a gallium arsenide layer 3 serving as the substrate of semiconductor device. In this approach, the buffer layer 2 is deposited on the silicon wafer 1 in the amorphous state to a thickness of about 100-200 Å at a temperature of about 400° C.-450° C. and then the gallium arsenide layer 3 is grown to a thickness of about 3-5 μm. When the gallium arsenide layer 3 is grown, the underlying gallium arsenide buffer layer 2 is crystallized into a single crystal phase and the gallium arsenide substrate layer 3 deposited thereon grows while maintaining an epitaxial relation with the gallium arsenide buffer layer 2 underneath.

In the foregoing method, although the gallium arsenide layer 3 is grown successfully on the silicon wafer 1, there is a problem in that the dislocation density in the gallium arsenide layer grown on the substrate cannot be reduced below about $10^8/cm^2$. Such a dislocation occurs mainly at the interface between the silicon wafer 1 and the buffer layer 2 as illustrated in FIG. 1 by a line 4, due to the lattice mismatch between silicon and GaAs. The buffer layer 2 is thus not effective in intercepting the propagation of the dislocations, and the dislocations extend into the gallium arsenide layer 3 on which the semiconductor devices are to be formed. In addition to the dislocations originating at the foregoing interface 4, dislocations are also created due to the surface defects or intrinsic defects involved in the wafer 1. The problem of the latter type of dislocations becomes conspicuous when a single crystal gallium arsenide wafer is used in place of the silicon wafer 1.

In a semiconductor device, such as a field effect transistor (FET) formed on the gallium arsenide layer 3, the threshold voltage scatters unacceptably when the dislocation density exceeds about $10^6 cm^{-2}$ and accordingly, the yield of the fabricated semiconductor device is inevitably decreased. Further, the existence of the dislocations causes a decrease of lifetime of the carrier or an increase of the leakage current across the p-n junction. When the device is an optical semiconductor device such as laser diode, the optical output is also decreased.

Meanwhile, it is known that the dislocation density of a GaAs bulk crystal grown by the Czochralski method can be reduced to about $100$ $cm^{-2}$ by adding indium (In) with a concentration level of $2 \times 10^{19}$ $cm^{-2}$ (Mil'-vidsky, M. G., Osvensky, V. B. and Shifrin, S. S., J. Crystal. Growth, 52, p.396, 1981). However, the wafer sliced from such a bulk crystal has a composition of InGaAs and the utility of the wafer is limited. Further, addition of In to the GaAs layer grown on another GaAs buffer layer as in the case of FIG. 1 is generally unsuccessful as the addition of In in such a concentration, or amount, inevitably causes an unacceptable lattice mismatch. Even when successful, the growth of the GaAs layer containing In would create a significant amount of dislocations at the boundary with the underlying layer, with a worse result. Growth of another GaAs layer on the buffer layer thus added with In is not possible because of the same reason.

SUMMARY OF THE INVENTION

Accordingly, it is a general object of the present invention to provide a novel and useful buffer structure wherein the aforementioned problems are eliminated.

Another object of the present invention is to provide a buffer structure interposed between an upper compound semiconductor layer and a lower material layer for intercepting propagation of dislocations from the underlying material layer to the overlying semiconductor layer.

Another object of the present invention is to provide a buffer structure comprising a buffer layer interposed between an upper compound semiconductor layer and a lower material layer, wherein the buffer layer contains a group III element which is effective for intercepting dislocations, with a compositional profile which takes a maximum value at a central part of the buffer structure and a minimum value at top and bottom boundaries thereof, respectively in contact with the upper compound semiconductor layer and the lower material layer. According to the present invention, propagation of dislocations into the upper compound semiconductor layer is effectively intercepted by the buffer layer containing the group III element. Further, the lattice mismatch which would occur between the buffer layer and the compound semiconductor layer or between the buffer layer and the underlying material layer as a result of the admixing of the group III element, is successfully avoided by providing the graded compositional profile to the buffer structure. Furthermore, creation of new dislocations at the boundary with the underlying layer or with the overlying layer is suppressed to a minimum because of the lattice matching thus achieved. As a result, a buffer structure which is effective for intercepting the propagation of the dislocations is obtained.

By choosing the compositional profile of the buffer structure such that the content of the group III element changes stepwise, in other words, by constructing the buffer structure as a number of stacked, thin layers each having its own content of the group III element, the dislocations are not only intercepted by the group III element but also trapped at the corresponding boundaries between the layers and the efficiency of intercepting the dislocations is further improved.

Other objects and further features of the present invention will become apparent from the following detailed descriptions when read in conjunction with the attached drawings.

DETAILED DESCRIPTION

Figure 2:
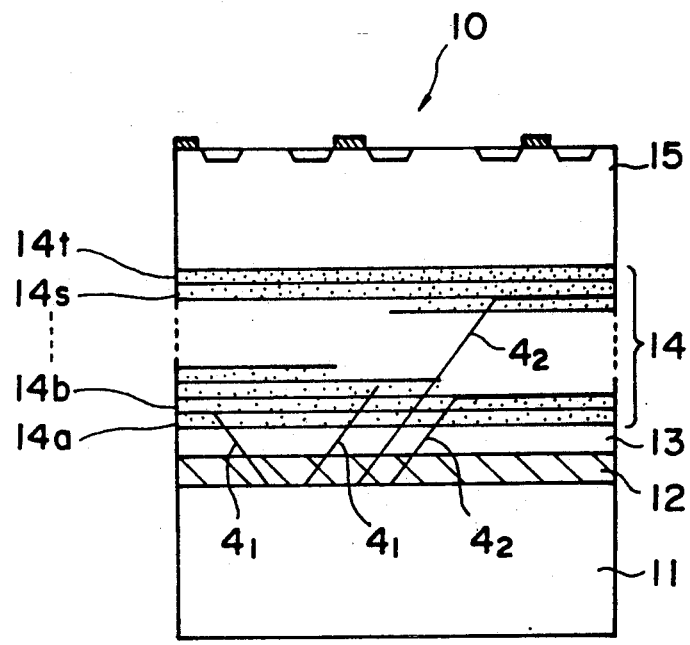
FIG. 2 is a diagram showing a buffer structure according to an embodiment of the present invention.

Hereinafter, a first embodiment of the buffer structure according to the present invention will be described with reference to FIG. 2 showing a cross section of a compound semiconductor device 10 such as a field effect transistor (FET) constructed on the buffer structure of the present invention.

Referring to the drawing, the semiconductor device comprises a silicon substrate or wafer 11 on which a first buffer layer 12 of GaAs is grown for a thickness of 100 Å, and on the first buffer layer 12, a first mixed crystal layer 13 of GaAs, a second buffer layer 14 of InGaAs constituting the essential part of the present invention and having a composition $Ga_{1-x}In_xAs$, and a second mixed crystal layer 15 of GaAs are grown successively with thicknesses of 1.5 μm, 0.2 μm, and 1.5 μm, respectively. The semiconductor device 10 is constructed on the second mixed crystal layer 15. In other words, it is desired to suppress the dislocation density in the layer 15 to as low a level as possible. Note that the first buffer layer 12 is in the amorphous phase when it is initially grown on the silicon wafer 11 but is later crystallized to a single crystal phase when the first mixed crystal layer 13 is grown thereon.

Figure 3:
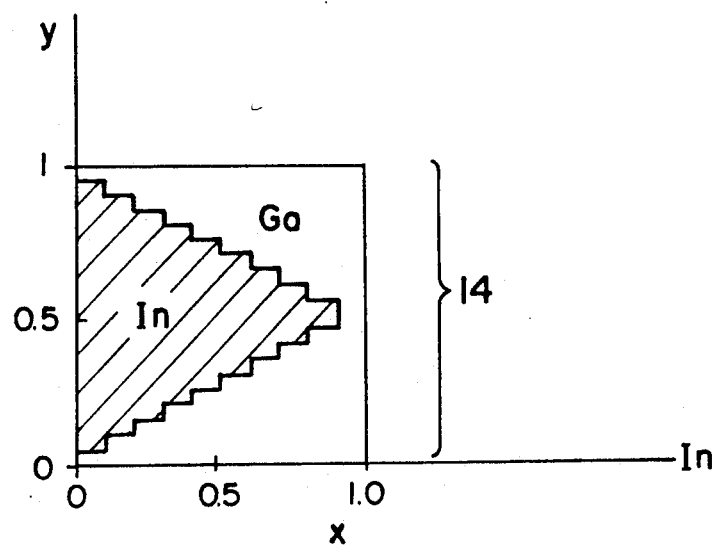
FIG. 3 is a graph of the compositional profile of the buffer structure of FIG. 2.

FIG. 3 shows the compositional profile of the second buffer layer 14. The content of In represented by the parameter x in the foregoing formula set to zero, both at the upper boundary (y=1) in contact with the second mixed crystal layer 15 and at the lower boundary (y=0) in contact with the first mixed crystal layer 13, while the parameter x reaches a maximum value (x=0.9) at the central part of the buffer layer 14 (y=0.5). Note that the axis y represents the thickness of the second buffer layer 14 measured perpendicularly to the substrate 11. In this embodiment, the parameter x is increased stepwise by an amount of 0.1 for each successive 100 Å of thickness of the layer 14. In other words, the buffer layer 14 comprises a number of thin InGaAs layers 14a-14t (FIG. 2) each having its own In-content and a thickness of about 100 Å.

Next, the function of the foregoing buffer structure will be described.

Figure 1:
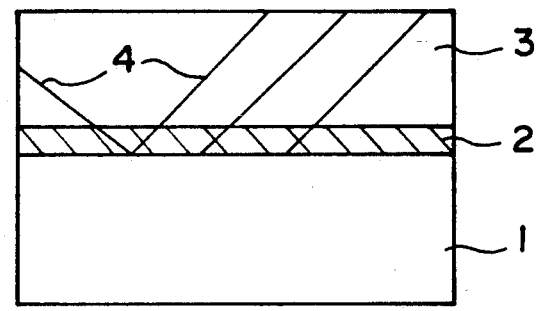
FIG. 1 is a cross sectional view showing a prior art buffer structure.

In the foregoing structure, the distortion caused as a result of the lattice mismatch between Si and GaAs is absorbed by the first buffer layer 12 interposed between the silicon wafer 11 and the first mixed crystal layer 13. As already described, the first buffer layer 12 is grown in the amorphous state and thus covers the surface of the silicon wafer 11 with reliability. When the first mixed crystal layer 13 is grown thereon, the first buffer layer 12 is crystalized. Thereby, the dislocation density in the first mixed crystal layer 13 is reduced to about $10^8$ cm$^{-2}$. This dislocation density, however, is not acceptable for constructing semiconductor devices on the mixed crystal layer 13. Increase of the thickness of the first buffer layer 12 or the first mixed crystal layer 13 is not effective in reducing the dislocation density below the foregoing level, as the dislocations are propagated without substantial interception through these layers as shown in FIG. 1.

In the second buffer layer 14 containing In, dislocations $41_1$ (FIG. 2) passed through the first buffer layer 12 and further through the first mixed crystal layer 13 are intercepted by In which is believed to induce a local strain in the host crystal structure, and the dislocations are trapped in such a strained region (Mil'vidsky et al. op.cit.). As the In-content x is graded as shown in FIG. 3 such that the parameter x is zero at the upper and lower boundary of the second buffer layer 14, the composition of the second buffer layer 14 becomes identical to that of the underlying first mixed crystal layer 13 or the overlying second mixed crystal layer 15 and the problem of lattice mismatch at the upper and lower boundaries of the second buffer layer 14 is eliminated. Further, it is believed that some of the dislocations $4_2$ are diverted by the In atoms and thereby trapped at the interface between the layers 14a-14t constituting the layered second buffer layer 14 as shown in FIG. 2. Thus, the stepwise increment of the In-content in the buffer structure of the present embodiment is particularly preferable from the view point of intercepting the dislocations effectively.

In one experiment for demonstrating the effect of the buffer structure of the present invention, measurement of the dislocation density of the mixed crystal layer 15 is undertaken by processing the structure of FIG. 2 in a potassium hydroxide (KOH) solution at 370° C. for 10 minutes and counting the etch pits appearing on the surface of the layer 15, with a result that the dislocation density of $10^8$ cm$^{-2}$ in the underlying GaAs layer 13 is reduced to $2 \times 10^6$ cm$^{-2}$ in the second mixed crystal layer 15. This level is acceptable for constructing a FET on the layer 15. In another measurement, it was observed that the dislocation density in the layer 15 is reduced to about $1 \times 10^6$ cm$^{-2}$.

Figure 4:
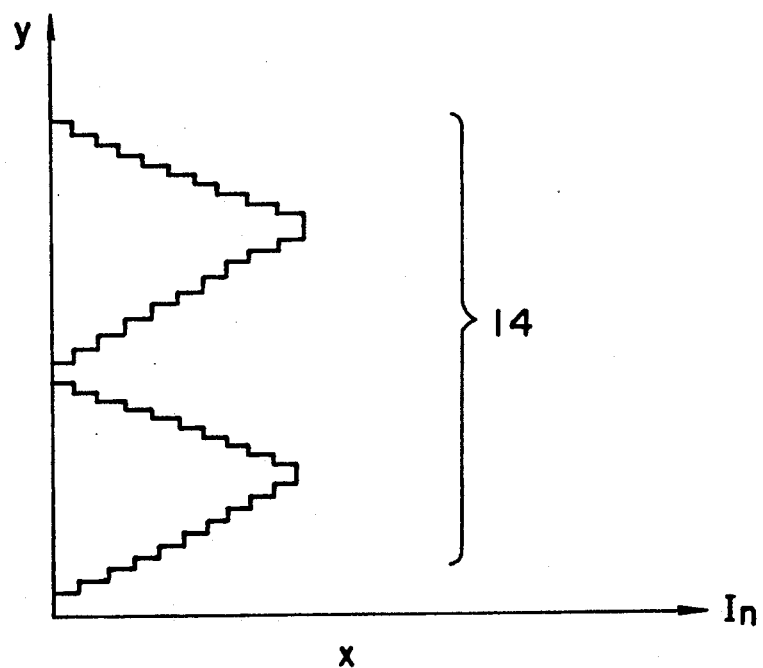
FIG. 4 is a graph of the compositional profile of the buffer structure according to a second embodiment.

Further, by repeating the compositional profile of FIG. 3 for a number of times, in the second buffer layer 14 as shown in FIG. 4 showing a second embodiment, the dislocation density in the second mixed crystal layer 15 at the top of the structure is decreased further. From the foregoing observation, the dislocation density is decreased by a factor of $10^2$ for each repetition of the compositional profile. Note that mere extension of the thickness of the second buffer layer 14, which causes formation of a region enriched in InAs at the central part of the layer 14, would be ineffective in intercepting the dislocations, as the interception of the dislocations is not caused by the In atom itself but the strain induced in the crystal structure of GaAs by the addition of In. In such an almost pure InAs structure, there would be no such strain in the structure. This means, on the other hand, that the element to be added to the buffer structure with the compositional profile of FIG. 3 is not limited to In but other elements, different from Ga such as boron (B) or aluminium (Al) may also be used in the base buffer layer 14 as is supported by Mil'vidsky et al. (op. cit.).

Next, the steps of constructing the buffer structure of FIG. 2 will be described with reference to FIGS. 6(A)-(F) together with the apparatus used for growing the crystal layers.

Figure 5:
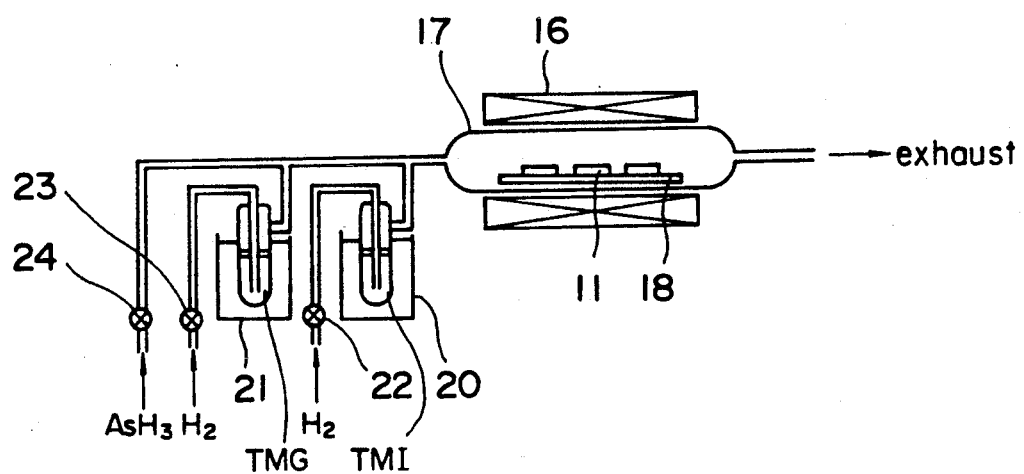
FIG. 5 is a schematic diagram of an apparatus used for growing the buffer structure of FIG. 2 in the present invention.

FIG. 5 shows the general construction of MOCVD apparatus used for growing the compound semiconductor layers in the structure of FIG. 2. Referring to the drawing, the silicon wafer 11 is placed on a susceptor 18 in a reaction chamber 17 and is heated together with the susceptor 18 by energization of a radio frequency coil 16. Further, a suitable combination of arsine (AsH$_3$), trimethyl gallium (TMG: (CH$_3$)$_3$Ga), and trimethyl indium (TMI: (CH$_3$)$_3$In) are introduced to the reaction chamber 17 together with a hydrogen (H$_2$) carrier gas. TMI and TMG are liquid in the normal state and are held in thermostatted containers 21 and 22 at a temperature of 15° C. and 30° C., respectively. By bubbling the liquids using H$_2$, the gaseous molecules of TMG and TMI are supplied to the reaction chamber 17 through control valves 22 and 23. Further, arsine, held at a temperature of 0° C., is introduced to the reaction chamber 17 through a control valve 24.

Figure 6A:
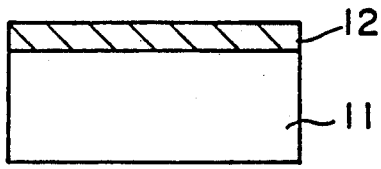
FIGS. 6(A)-(F) are diagrams showing various steps of forming the buffer structure of FIG. 2.

In a first step, the silicon wafer 20 is held at 1000° C. for about 10 minutes in the reaction chamber 17 and then the temperature of the wafer 11 is set to 450° C. Further, TMG and arsine are introduced to the reaction chamber 17. Thereby, the gaseous molecules thus introduced are reacted at the surface of the substrate 20 and the first buffer layer 12 is grown on the wafer 20 covering its surface in the amorphous state as shown in FIG. 6(A).

Figure 6B:
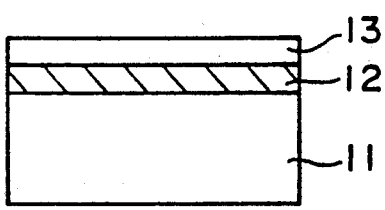

Next, the temperature of the wafer 11 is raised to 700° C. and TMG and arsine are introduced into the reaction chamber 17. As a result, the first mixed crystal layer 13 is grown on the first buffer layer 12 and a structure shown in FIG. 6(B) is obtained. During this step, the previously grown amorphous buffer layer 22 is crystalized into a single crystal phase.

Figure 6C:
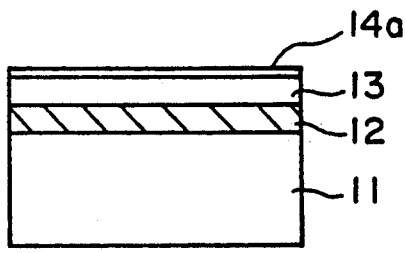
Figure 6D:
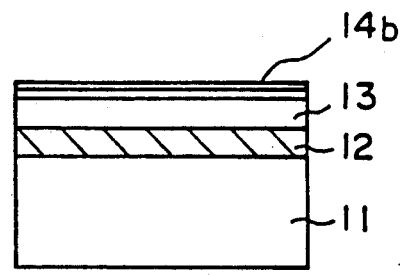

Further, the flow rate of arsine and TMG are set to 200 cc/min and 70 cc/min, respectively and a first layer 14a of the second buffer layer 14 which is free from In is grown on the first mixed crystal layer 13 to a thickness of about 100 Å as shown in FIG. 6(C). Next, TMI is introduced further to TMG and arsine with a flow rate of 143 cc/min, and a structure shown in FIG. 6(D) is obtained in which a second layer 14b having a composition Ga$_{0.9}$In$_{0.1}$As is grown on the first layer 14a. Note that the flow rate of TMG and arsine are set similarly to the case of FIG. 6(C).

Figure 6E:
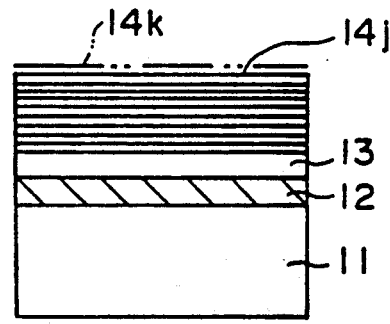

Further, by changing the flow rate of TMG and TMI stepwise, a number of layers of InGaAs each having a thickness of about 100 Å are grown one after another as shown in FIG. 6(E) with a stepwise increment of the In-content. In a tenth layer 14j, the In-content becomes maximum and the parameter x takes a value of 0.9. In other words, the composition of the InGaAs layer is represented as Ga$_{0.1}$In$_{0.9}$As.

Figure 6F:
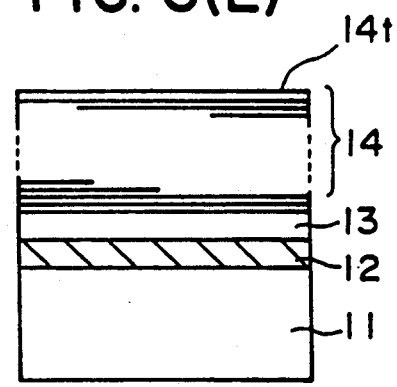

Next, an eleventh layer 14k is grown on the tenth layer 14j with a composition identical to the layer 14j to a thickness of 100 Å and further, other layers are grown thereon with a stepwise decrease of the In-content with a decrement of 0.1 in each layer by changing the ratio of TMG and TEI stepwise until a twentieth layer 14t is grown in which the In-content is zero as shown in FIG. 6(F). In each of the layers 14k through 14t, the thickness of the layer is maintained at 100 Å and thus, a symmetrical compositional profile having a maximum of the In-content at the center of the buffer layer 14 as shown in FIG. 3 is obtained.

After the twentieth layer 14t is grown, the supply of TMI is stopped and the second mixed crystal layer 15 is grown while supplying arsine and TMG. As a result, the structure shown in FIG. 2 is completed.

The apparatus used for constructing the structures of FIGS. 6(A)-6(F) is of course not limited to the MOCVD apparatus of FIG. 5 but a MBE apparatus may also be used. In this apparatus, too, a stepwise compositional profile as shown in FIG. 3 is easily obtained. Further, by changing the temperature of cells (not shown) holding the source material in such an apparatus, or by changing the ratio of TMG and TMI continuously in the apparatus of FIG. 5, a compositional profile shown in FIG. 7 in which the In-content x is changed continuously instead of stepwise is also achieved. In this compositional profile, too, the dislocations are intercepted by the In atoms and at the same time, the lattice mismatch to the neighbouring layers 13 and 15 by incorporating In to the buffer layer 14 is avoided by providing the compositional gradation.

Figure 7:
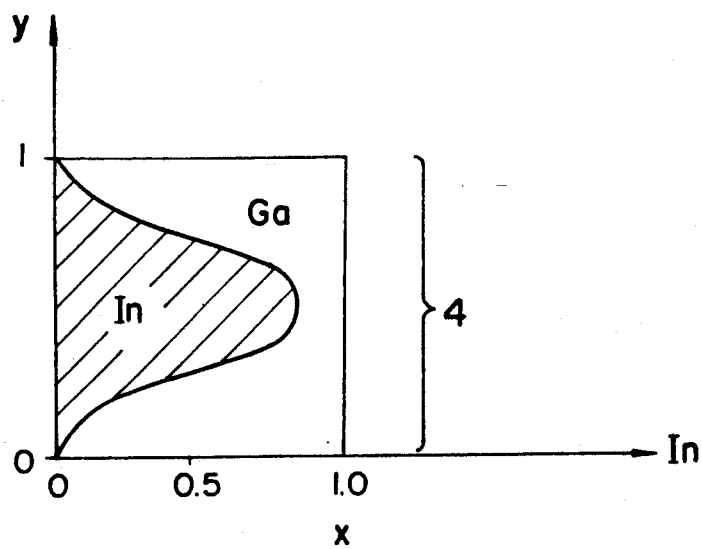
FIG. 7 is a graph of the compositional profile of the buffer structure according to a third embodiment.

Further, the stepwise compositional increment is not limited to 0.1 as shown in FIG. 3. Similarly, the thickness of the layers 14a-14t is not limited to 100 Å either. As a matter of fact, a continuous compositional profile shown in FIG. 7 is obtained as an extreme case in which the thickness of each layer is reduced to infinitesimal and the compositional increment of In is also reduced to infinitesimal. From the view point of trapping the dislocations at the boundary between the layers, however, it is preferred to form a distinct interface between the layers of the buffer layer 14 by providing the stepwise compositional profile. For this purpose, a stepwise increment of In-content of less than 0.1 and a layer thickness of more than 100 Å are preferred, wherein the stepwise increment of 0.1 for the In-content and the layer thickness of 100 Å A as described are most preferred.

Obviously, the maximum of the In-content at the central part of the buffer layer 14 is not limited to 0.9 as described but may be smaller or larger and the central part of the buffer layer 14 may comprise pure InAs. Further, the compositional profile of In need not necessarily be symmetrical about the central part of the buffer layer 14 but may be asymmetrical. Furthermore, the In-content at the top and bottom boundary of the buffer layer 14 need not necessarily be zero but may have a finite level, unless an unacceptable lattice mismatch is induced at the boundaries. The present invention includes also a case in which the first mixed crystal layer 13 and the second mixed crystal layer 15 have different, respective compositions. In such a case, the compositional profile is asymmetric and the In-content may not be equal at the top boundary and at the bottom boundary of the buffer layer 14.

As already described, the element incorporated in the GaAs buffer layer 14 is not limited to In but other group III elements, such as B or Al, may also be used. Further, the present invention is effective also when the first buffer layer 12 comprises gallium phosphide (GaP) and the second buffer layer 14 comprises GaP with added In. For this case, the first and second mixed crystal layers 13 and 15 also comprises GaP and the second buffer layer 14 is provided with the compositional profile similar to FIG. 3.

Further, the present invention is not limited to the buffer structure constructed on the silicon wafer but is applicable also to a case of growing a semiconductor layer free from dislocations or other defects on a semiconductor substrate or wafer of a common composition. For example, the present invention is effective in growing a GaAs layer free from such defects on a GaAs wafer which usually contains a significant amount of defects. In this case, the GaAs wafer is used as the wafer 11 in the structure of FIG. 2. Further, the semiconductor material to be used as the wafer 11 and as the layers 13 and 15 in such a construction is not limited to GaAs but other materials such as germanium (Ge), gallium phosphide (GaP), gallium antimonide (GaSb), indium phosphide (InP), indium arsenide (InAs), indium antimonide (InSb), and the like may be used similarly.

When the buffer layer 14 in the structure of FIG. 2 comprises a compound semiconductor material containing Ga such as GaAs, GaP or GaSb, elements such as In, B or Al are effective as the group III element for intercepting the dislocations while, when the buffer layer 14 comprises a compound semiconductor material containing In such as InAs, InP or InSb, elements such as Ga, B or Al are effective as the group III element in agreement with the report by Mil'vidsky et al. (op. cit.) for the case of a bulk crystal. In any of these cases, the content of the group III elements for intercepting the dislocations should be graded as shown in FIG. 3, preferrably with a stepwise profile.

Further, the present invention is not limited to these embodiments described heretofore, but various variations and modifications may be made without departing from the scope of the invention.

What is claimed is:

1. A semiconductor device, comprising:
    a substrate of a semiconductor material and having upper and lower major surfaces;
    a buffer layer comprising first and second layers of respective group III-V compound semiconductor materials, each of said first and second layers having respective upper and lower major surfaces, said lower surface of said first layer being formed on said upper surface of said substrate and said lower surface of said second layer being formed on said upper surface of said first layer, said group III-V compound semiconductor material of said second layer comprising first and second, different, group III elements and a group V element, said second group III element having a concentration level distribution in said second layer varying from a minimum concentration level at each of said upper and lower major surfaces thereof to a maximum concentration level between said upper and lower major surfaces thereof;
    a device layer having upper and lower major surfaces and formed with said lower surface thereof on said upper surface of said second layer of said buffer layer, said device layer comprising a group III-V compound semiconductor material and having an active device formed in said upper surface thereof; and
    said buffer layer intercepting defects, originating at and propagating from the upper major surface of the substrate and into the buffer layer, and thereby suppressing further propagation of said defects into device layer.

2. A semiconductor device as claimed in claim 1 in which the concentration level of the second group III element changes in stepwise fashion in said second layer of said buffer layer.

3. A semiconductor device as claimed in claim 1 in which the concentration level of the second group III element changes continuously in the second layer of said buffer layer.

4. A semiconductor device as claimed in claim 1 in which the concentration level of the second group III element is zero at the upper and lower major surfaces of said second layer of said buffer layer.

5. A semiconductor device as claimed in claim 1 in which the variable concentration level distribution of the second group III element has a single maximum in said second layer of said buffer layer.

6. A semiconductor device as claimed in claim 1 in which the variable concentration level distribution of the second group III element has plural maxima in said second layer of said buffer layer.

7. A semiconductor device as claimed in claim 1 in which said first group III element comprises gallium and said second group III element comprises indium.

8. A semiconductor device as claimed in claim 1 in which said substrate is formed of a group III-V compound semiconductor material which is different from the group III-V compound semiconductor material of said device layer.

9. A semiconductor device as claimed in claim 8 in which said substrate comprises silicon.

10. A semiconductor device as claimed in claim 1 in which said substrate is formed of a group III-V compound semiconductor material which is identical to the group III-V compound semiconductor material of the device layer.

11. A semiconductor device as claimed in claim 10 in which said substrate comprises gallium arsenide.

* * * * *

UNITED STATES PATENT AND TRADEMARK OFFICE
CERTIFICATE OF CORRECTION

PATENT NO. : 5,134,446
DATED : July 28, 1992
INVENTOR(S) : Toshikazu INOUE

It is certified that error appears in the above-indentified patent and that said Letters Patent is hereby corrected as shown below:

* TITLE PAGE: [57] ABSTRACT, line 1, change "service" to --device--.

* Col. 1, line 37, change "arises" to --arise--;

* line 63, after "of" insert --a--.

* Col. 4, line 64, change "view point" to --viewpoint--.

Col. 5, line 6, change "2 × 106cm$^{-2}$" to --2 × 10$^6$cm$^{-2}$--;
  line 10, change "1 × 106cm$^{-2}$" to --1 × 10$^6$cm$^{-2}$--.

* Col. 7, line 39, change "detects" to --defects--.

Col. 8, line 28, after "into" insert --said--.

Signed and Sealed this

Seventeenth Day of May, 1994

Attest:

BRUCE LEHMAN

Attesting Officer         Commissioner of Patents and Trademarks